United States Patent [19]
Cheung et al.

[11] Patent Number: 6,083,842
[45] Date of Patent: Jul. 4, 2000

[54] FABRICATION OF A VIA PLUG HAVING HIGH ASPECT RATIO WITH A DIFFUSION BARRIER LAYER EFFECTIVELY SURROUNDING THE VIA PLUG

[75] Inventors: Robin Cheung, Cupertino; Sergey Lopatin, Santa Clara, both of Calif.

[73] Assignee: Advanced Micro Devices Inc., Sunnyvale, Calif.

[21] Appl. No.: 09/253,479

[22] Filed: Feb. 19, 1999

[51] Int. Cl.$^7$ .................................................. H01L 21/302
[52] U.S. Cl. ........................ 438/706; 438/725; 438/785
[58] Field of Search .................................. 438/624, 625, 438/626, 627, 690, 691, 692, 706, 710, 712, 725, 785

[56] References Cited

U.S. PATENT DOCUMENTS

| | | | |
|---|---|---|---|
| 5,695,810 | 12/1997 | Dubin et al. | 427/96 |
| 5,770,517 | 6/1998 | Gardner et al. | 438/627 |
| 6,001,415 | 12/1999 | Nogami et al. | 427/97 |
| 6,025,273 | 2/2000 | Chen et al. | 438/706 |

OTHER PUBLICATIONS

S. Lopatin, Y. Kim, and Y. Shacham–Diamand, *Electrochemical and Material Study of Electroless Ternary Barriers for Copper Interconnects*, Mat. Res. Soc. Symp. Proc., vol. 514, 1998 Materials Research Society, pp. 433–438.

S. Lopatin, Y. Shacham–Diamand, V. Dubin, P.K. Vasudev, J. Pellerin, and B. Zhao, *Electroless CoWP Barrier/Protection Layer Deposition for Cu Metallization*, Mat. Res. Soc. Symp. Proc., vol. 451, 1997 Materials Research Society, pp. 463–468.

*Primary Examiner*—Benjamin L. Utech
*Assistant Examiner*—Kin-Chan Chen
*Attorney, Agent, or Firm*—Monica H. Choi

[57] ABSTRACT

A method for efficiently fabricating a via plug having high aspect ratio within an insulating layer with a diffusion barrier layer effectively surrounding the via plug. The method includes the steps of depositing a via photoresist layer over a first metal line of a first conductive material and etching a via hole in the via photoresist layer. The first conductive material of the first metal line is exposed at a bottom wall of the via hole. A via plug of a second conductive material is deposited into the via hole, and the via plug makes a conductive path with the first metal line. The via photoresist layer is then removed such that any side wall of the via plug is exposed. A first diffusion barrier layer is then deposited onto any exposed surface of the second conductive material of the via plug. A via insulating layer is then spin-coated to surround the via plug and a trench insulating layer is also deposited over the via insulating layer. A trench is then etched over the via plug having the first diffusion barrier layer, and the via plug with the first diffusion barrier layer is exposed as part of a bottom wall of the trench. A second diffusion barrier layer is then deposited onto the walls of the trench, and a third conductive material is deposited into the trench to form a second metal line. The second metal line makes a conductive path with the second conductive material of the via plug. Thus, the present invention avoids the prior art method of depositing a diffusion barrier layer into the via hole within a via insulating layer before filling the via hole with the via plug. With the present invention, a via plug with high aspect ratio may be efficiently formed with the diffusion barrier layer effectively surrounding the via plug.

12 Claims, 3 Drawing Sheets

FABRICATION OF A VIA PLUG HAVING HIGH ASPECT RATIO WITH A DIFFUSION BARRIER LAYER EFFECTIVELY SURROUNDING THE VIA PLUG

TECHNICAL FIELD

This invention relates to metallization in integrated circuits, and more particularly, to an efficient method for forming a via plug within an insulating layer with a diffusion barrier layer effectively surrounding the via plug.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield during IC fabrication. Such advantages are a driving force to constantly scale down IC dimensions.

With the scaling down of integrated circuit dimensions, openings, which are etched within the integrated circuit, are reduced in size. The aspect ratio of the opening, which is defined as the ratio of the depth of the opening to the width of the opening, increases with scaling down of integrated circuit dimensions.

The present invention is described with copper metallization for small geometry integrated circuits. However, the present invention may be used with any other conductive material that is amenable for small geometry integrated circuits aside from just the example of copper, as would be apparent to one of ordinary skill in the art from the description herein.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and shorted metal lines, is now a commonly recognized problem. Moreover, as dimensions of metal lines further decrease, metal line resistance increases substantially, and this increase in line resistance may adversely affect circuit performance.

Given the concerns of electromigration failure and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

However, copper lines cannot be etched using conventional etching processes as used for aluminum. Thus, copper lines are typically fabricated using a damascene etch process. In such a process, a trench is etched within an insulating layer. That trench is then filled with copper. The surface of the integrated circuit is then polished such that the copper line is contained within the trench.

Referring to FIG. 1, integrated circuits typically include multi-level metallization. A first metal line 102 is contained within a first trench 104 etched in a first trench insulating layer 106. A second metal line 108 is contained within a second trench 110 etched in a second trench insulating layer 112. The first metal line 102 is on a first metallization level on the integrated circuit, and the second metal line 108 is on a second metallization level on the integrated circuit. A via interconnects the metal lines 102 and 108 on the two different metallization levels. A via plug 114 is comprised of a conductive material and is disposed within a via hole 116 etched in a via insulating layer 118. The insulating layers 106, 112, and 118 are comprised of any insulating material such as any form of oxides as is known to one of ordinary skill in the art.

Referring to FIG. 2, if the second trench 110 and the via hole 116 were not filled with a conductive material, a top view of the integrated circuit of FIG. 1 shows the second trench 110 running over the via hole 116. The first metal line 102 is disposed on the bottom of the via hole 116. FIG. 1 is a cross-sectional view of the integrated circuit of FIG. 2 along line AA after the via hole 116 and the second trench 110 have been filled with a conductive material.

In addition, copper is a mid-bandgap impurity in silicon and silicon dioxide. Thus, copper may diffuse easily into these common integrated circuit materials. For example, a copper plug within a via hole may contact the insulating layer surrounding the via hole. Because copper may easily diffuse into the insulating layer, this diffusion may degrade the performance of integrated circuits. Nevertheless, use of copper metallization is desirable for further scaling down integrated circuit dimensions because of the lower bulk resistivity and the higher electromigration tolerance.

Thus, a diffusion barrier layer is deposited between copper and any surrounding insulating layer. The diffusion barrier layer impedes diffusion of copper into the surrounding insulating layer. For example, referring to FIG. 1, a diffusion barrier layer would be disposed on the side walls of the via hole 116 between the via plug 114 and the via insulating layer 118. Such a diffusion barrier layer impedes diffusion of copper from the via plug 114 into the via insulating layer 118.

In the prior art, the diffusion barrier layer is deposited into the via hole 116, and then the via hole 116 is filled with the via plug 114. However, for small geometry metal lines, the via hole 116 may have a relatively high aspect ratio such that depositing a diffusion barrier layer into the via hole 116 is difficult. When the via hole 116 has a relatively high aspect ratio, the diffusion barrier layer may not effectively adhere to the side walls and corners of the via hole 116.

Thus, a method for efficiently forming a via plug having high aspect ratio within an insulating layer is desired with a diffusion barrier layer effectively surrounding the via plug.

SUMMARY OF THE INVENTION

Accordingly, a primary object of the present invention is to efficiently form a via plug having high aspect ratio within an insulating layer with a diffusion barrier layer effectively surrounding the via plug.

In a general aspect, the present invention is a method for fabricating a via plug within an integrated circuit wafer. The method includes the steps of depositing a via photoresist layer over a first metal line of a first conductive material and etching a via hole in the via photoresist layer. The first conductive material of the first metal line is exposed at a bottom wall of the via hole. The method further includes the step of depositing a via plug of a second conductive material into the via hole, and the via plug makes a conductive path with the first metal line. The method also includes the step of removing the via photoresist layer such that any side wall of the via plug is exposed. Also, the method includes the step of selectively depositing a first diffusion barrier layer onto any exposed surface of the second conductive material of the via plug.

The method may further include the steps of spin coating a via insulating layer of low dielectric constant to surround the via plug and depositing a trench insulating layer over the via insulating layer. A trench is then etched over the via plug having the first diffusion barrier layer, and the via plug with the first diffusion barrier layer is exposed as part of a bottom wall of the trench. A second diffusion barrier layer is then deposited onto the walls of the trench, and a third conductive material is deposited into the trench to form a second metal line. The second metal line makes a conductive path with the second conductive material of the via plug.

In this manner, the side walls of the via plug are exposed and then the diffusion barrier layer is selectively deposited onto the material of the via plug. The via insulating layer is then spin coated to surround the via plug with the diffusion barrier layer already deposited on the via plug. Thus, the present invention avoids the prior art method of depositing a diffusion barrier layer into the via hole within a via insulating layer before filling the via hole with the via plug. With the present invention, a via plug with high aspect ratio may be efficiently formed with the diffusion barrier layer effectively surrounding the via plug.

The present invention may be used to particular advantage when the second conductive material of the via plug, the first conductive material of the first metal line, and the third conductive material of the second metal line, are copper, for fine line metallization within small geometry integrated circuits.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

The present invention is described with copper metallization for small geometry integrated circuits. However, the present invention may be used with any other conductive material, aside from just the example of copper, that is amenable for small geometry integrated circuits and that typically has a diffusion barrier layer, as would be apparent to one of ordinary skill in the art from the description herein.

Figure 1:
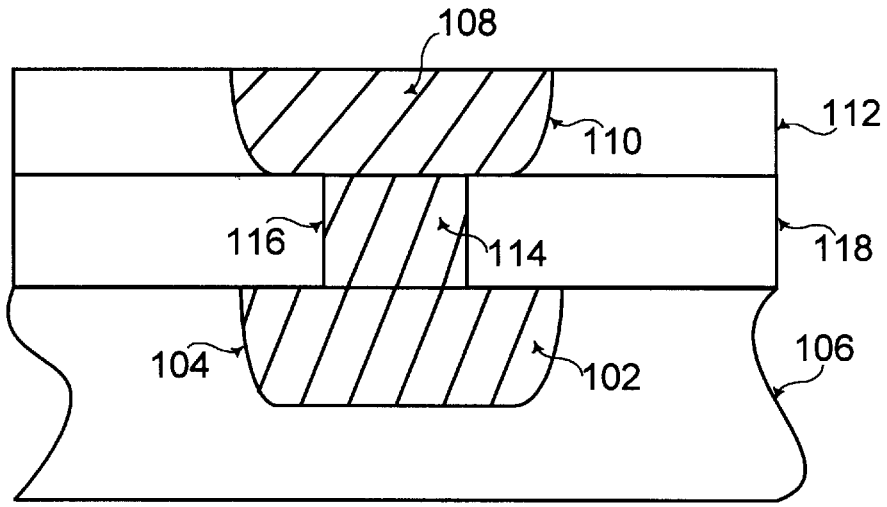
FIG. 1 shows a cross-section of multi-level metallization in an integrated circuit including a via for interconnecting metal lines on different levels.
Figure 2:
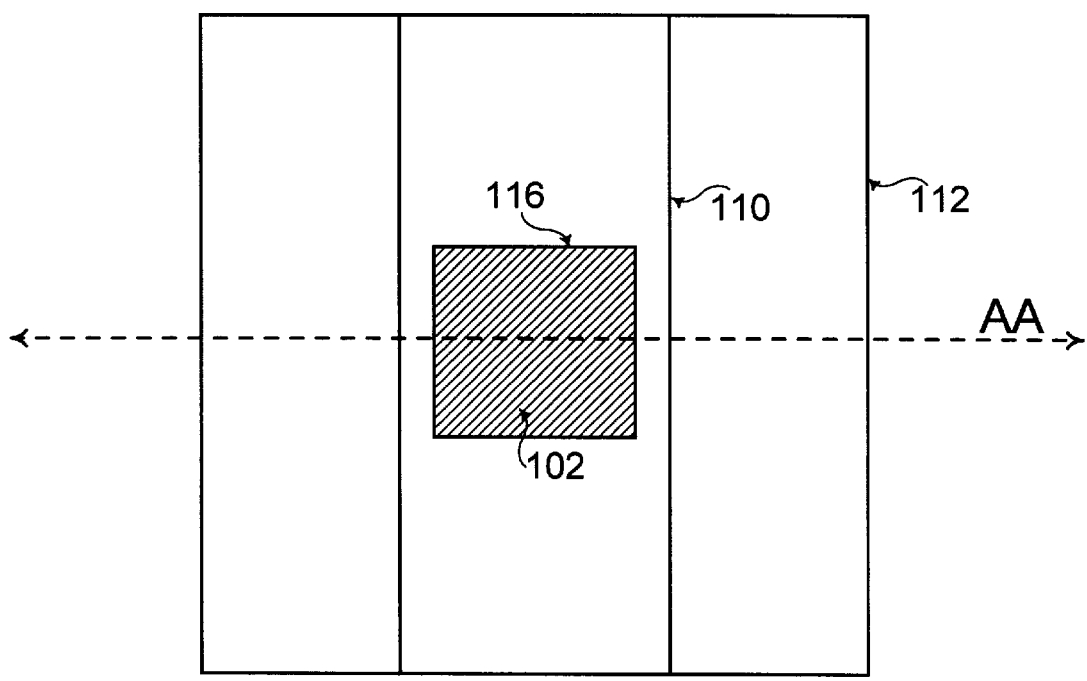
FIG. 2 shows a top view of the integrated circuit of FIG. 1.
Figure 3:
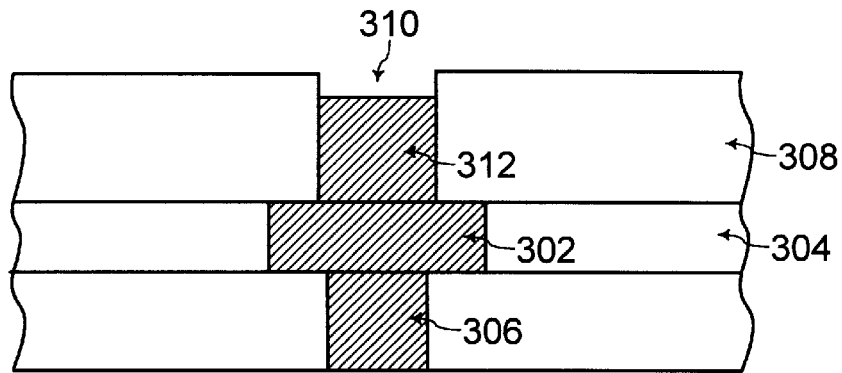
FIG. 3 shows the formation of a via plug within a photoresist layer, according to a step in the method of the present invention.

Referring to FIG. 3, a via plug is formed to be conductively coupled to a first metal line 302 of a first conductive material. The first metal line 302 is formed within a first insulating layer 304. The first metal layer 302 may be coupled via a tungsten plug 306 to an active area of an integrated circuit.

Referring to FIG. 3, a via photoresist layer 308 is deposited over the first metal line 302 and the first insulating layer 304. A via hole 310 is etched in the via photoresist layer 308, and the via hole 310 is aligned with respect to the first metal layer 302 such that the first conductive material of the first metal layer 302 is exposed at the bottom wall of the via hole 310.

Referring to FIG. 3, a second conductive material is deposited into the via hole 310 to form a via plug 312 such that the via plug 312 is conductively coupled to the first metal line 302. For copper metallization, the via plug 312 may preferably be deposited into the via hole 310 by electroless deposition. With the first metal layer 302 exposed at the bottom wall of the via hole 316, the first conductive material of the first metal line 302 acts as an autocatalytic surface during the electroless deposition of copper within the via hole 310.

In this manner, because the bottom wall of the via hole acts as the autocatalytic surface during the electroless deposition of copper within the via hole, the corners of the via hole are more compactly filled with copper. Thus, the via plug 312 makes good contact with the first metal layer 302.

Various electroless deposition processes for filling openings within an integrated circuit are known to one of ordinary skill in the art. Any type of electroless deposition processes known to one of ordinary skill in the art may be used for filling the via hole 310 in the method of the present invention, as would be apparent to one of ordinary skill in the art from the description herein.

Figure 4:
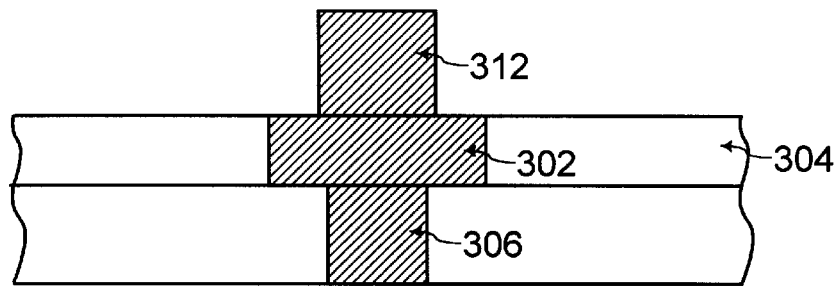
FIG. 4 shows removal of the photoresist layer of FIG. 3, according to another step in the method of the present invention.

Referring to FIG. 4, after the via plug 312 is filled within the via hole 310, the photoresist layer 308 is removed. Photoresist technology including application of the photoresist layer 308, patterning of the photoresist layer 308, and removal of the photoresist layer 308 is known to one of ordinary skill in the art of integrated circuit fabrication. Referring to FIG. 4, after removal of the photoresist layer 308, the via plug 312 remains with the side walls of the via plug 312 further exposed.

Figure 5:
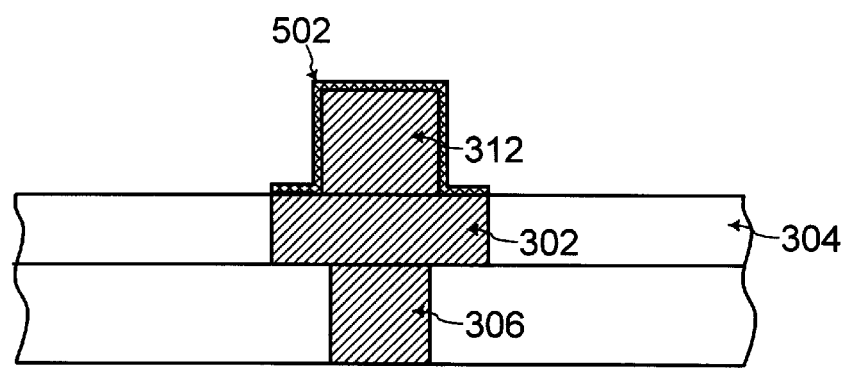
FIG. 5 shows a step of selectively depositing a diffusion barrier layer onto any exposed surface of the via plug in FIG. 4, according to another step in the method of the present invention.

Referring to FIG. 5, a diffusion barrier layer 502 is selectively deposited onto any exposed surface of the via plug 312. The diffusion barrier layer 502 for example may be comprised of cobalt tungsten phosphide (CoWP). In that case, during deposition of cobalt tungsten phosphide (CoWP), the cobalt tungsten phosphide (CoWP) will deposit substantially only onto exposed surfaces having copper. Referring to FIG. 5, cobalt tungsten phosphide (CoWP) deposits onto any exposed surfaces of the via plug 312 comprised of copper and onto any exposed surfaces of the first metal line 302 comprised of copper.

Deposition of cobalt tungsten phosphide (CoWP) may be performed by an electroless deposition process such as chemical vapor deposition (CVD) or plasma enhanced chemical vapor deposition (PECVD) as known to one of ordinary skill in the art. In addition to the example of cobalt tungsten phosphide (CoWP)), tungsten (W), tungsten nitride (WN), and tantalum nitride (TaN) may also be used for the selectively deposited diffusion barrier layer 502 by a deposition process such as chemical vapor deposition (CVD) or plasma enhanced chemical vapor deposition (PECVD) as known to one of ordinary skill in the art. Any type of diffusion barrier material which selectively deposits onto the second conductive material of the via plug 312 or onto the first conductive material of the first metal line 302 may be used for the diffusion barrier layer 502, as would be apparent from the description herein.

Figure 6:
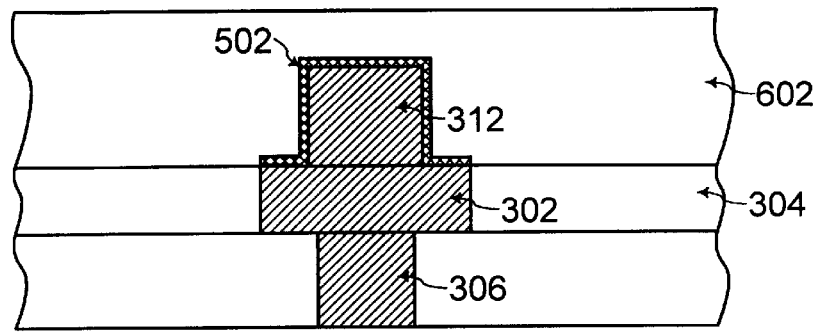
FIG. 6 shows a step of spin coating an insulating layer to surround the via plug having the diffusion barrier layer of FIG. 5, according to another step in the method of the present invention.

Referring to FIG. 6, with the diffusion barrier layer 502 thus effectively surrounding the via plug 302 and the first metal line 302, a via insulating layer 602 is spin coated to surround the via plug 312. The via insulating layer 602 is comprised preferably of an insulating material having low dielectric constant such that circuit performance is enhanced. Spin-coating processes for depositing insulating layers are known to one of ordinary skill in the art.

Figure 7:
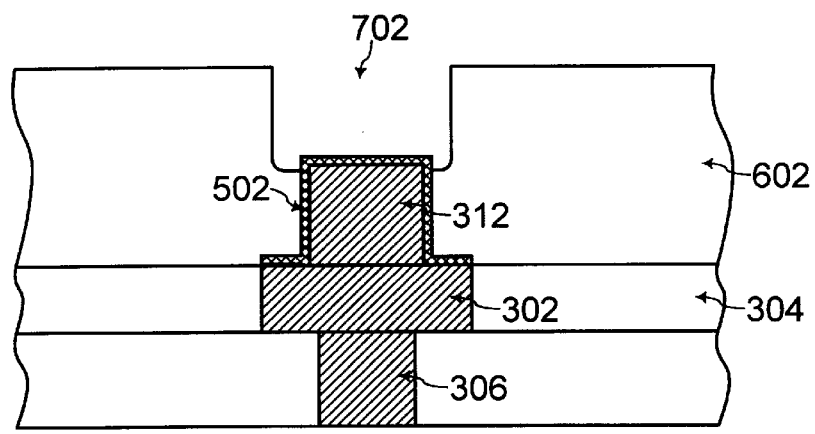
FIG. 7 shows a step of etching a trench for forming another metal line above the via plug of FIG. 6, according to another step in the method of the present invention.

Referring to FIG. 7, after spin coating the via insulating layer 602, a trench 702 is etched over the via plug 312 such that the via plug 312 with the diffusion barrier layer 502 is exposed as part of a bottom wall of the trench 702. The via insulating layer 602 may also act as a trench insulating layer if the via insulating layer 602 is a thick layer which extends up to cover the trench 702. Alternatively, a trench insulating layer may be further deposited over the via insulating layer 602.

Figure 8:
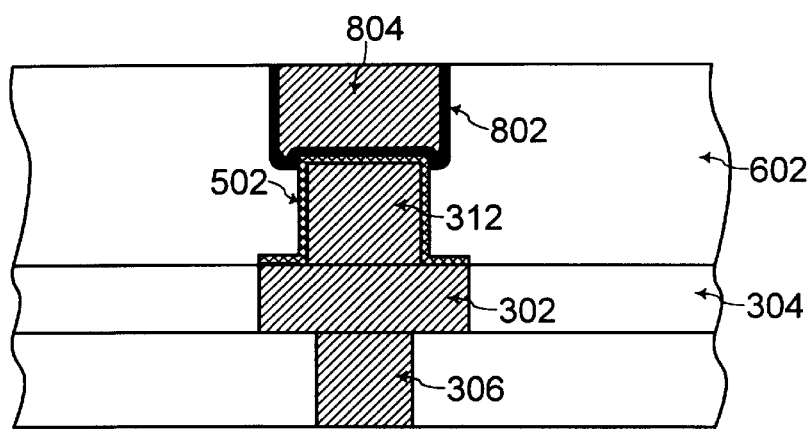
FIG. 8 shows filling the trench of FIG. 7 with a conductive material, according to another step in the method of the present invention.

Referring to FIG. 8, after the trench 702 is etched in the trench insulating layer, a trench diffusion barrier layer 802 is deposited to cover the walls of the trench 702. When the conductive material filling the trench 702 is copper, the trench diffusion barrier layer 802 may be selected from the group consisting of tantalum, tantalum nitride, tantalum copper, tantalum silicon nitride, tungsten, tungsten nitride, tungsten silicon nitride, titanium nitride, titanium/titanium nitride, and titanium silicon nitride. Such a diffusion barrier layer 802 impedes diffusion of conductive material within the trench 702 into the surrounding insulating layer.

The trench 702 is then filled with a third conductive material preferably by electroplating deposition. In that case, a seed layer of the third conductive material is initially deposited into the trench 702, and the third conductive material is electroplated into the trench from that seed layer. Various electroplating deposition processes for filling openings within an integrated circuit are known to one of ordinary skill in the art. Any type of electroplating deposition processes known to one of ordinary skill in the art may be used for filling the trench 702 in the method of the present invention, as would be apparent to one of ordinary skill in the art from the description herein.

The electroplating deposition process may result in deposition of the third conductive material all over the wafer having the via structure of FIG. 8. Thus, after the electroplating deposition process, the surface of the wafer is polished using a chemical mechanical polishing process as known to one of ordinary skill in the art. With such a polishing process, the third conductive material is confined to be contained within the trench 802 as shown in FIG. 7.

The third conductive material within the trench forms a second metal line 804 which is conductively coupled to the via plug 312. Thus, the via plug 312 conductively couples the first metal line 302 with the second metal line 804.

In this manner, the via plug 312 is first formed before a diffusion barrier layer is selectively deposited to surround the via plug 312. Then, a via insulating layer is spin-coated to surround the via plug 312 having the diffusion barrier layer. Thus, the diffusion barrier layer is effectively disposed between the via plug 312 and the via insulating layer.

The present invention is especially effective for forming via plugs of high aspect ratio with a diffusion barrier layer effectively surrounding the via plug. The present invention avoids the prior art process of filling the via hole having high aspect ratio with the barrier layer before depositing the via plug into the via hole.

The present invention may be used to particular advantage for fabrication of small geometry integrated circuits having copper metallization. In that case, the first conductive material of the first metal line 302 is copper, the second conductive material of the via plug 312 is copper, and the third conductive material of the second metal line 804 is copper. Copper is advantageous for small geometry metallization because of the lower bulk resistivity and the higher electromigration tolerance of copper. However, a diffusion barrier layer is also deposited to surround the copper to impede diffusion of copper into any surrounding insulating layer.

The foregoing is by way of example only and is not intended to be limiting. For example, the advantageous features of the present invention may be used when any type of conductive material, amenable for small geometry integrated circuit and which needs a diffusion barrier layer, is used for metallization. Furthermore, as will be understood by those skilled in the art, the integrated circuit structures described herein may be made or used in the same way regardless of their position and orientation. Accordingly, it is to be understood that terms and phrases such as "top," "bottom wall," and "side wall" as used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for fabricating a via plug within an integrated circuit wafer, the method comprising the steps of:
   A. depositing a via photoresist layer over a first metal line of a first conductive material;
   B. etching a via hole in said via photoresist layer, wherein said first conductive material of said first metal line is exposed at a bottom wall of said via hole;
   C. depositing a via plug of a second conductive material into said via hole, wherein said via plug is conductively coupled to said first metal line;
   D. removing said via photoresist layer such that any side wall of said via plug is exposed; and
   E. selectively depositing a first diffusion barrier layer onto any exposed surface of said second conductive material of said via plug.

2. The method of claim 1, further including the step of:
   selectively depositing said first diffusion barrier layer onto any exposed surface of said first conductive material of said first metal line in said step E.

3. The method of claim 1, wherein said via plug is deposited into said via hole using electroless deposition with the first conductive material of said first metal line at the bottom wall of said via hole acting as an autocatalytic surface for said electroless deposition.

4. The method of claim 1, wherein said second conductive material of said via plug is copper.

5. The method of claim 4, wherein said first conductive material of said first metal line and said third conductive material of said second metal line are copper.

6. The method of claim 1, wherein said first diffusion barrier layer is comprised of cobalt tungsten phosphide (CoWP).

7. The method of claim 1, wherein said first diffusion barrier layer is selected from the group consisting of tungsten (W), tungsten nitride (WN), and tantalum nitride (TaN).

8. The method of claim 1, further including the steps of:

spin coating a via insulating layer of low dielectric constant to surround said via plug;

depositing a trench insulating layer over said via insulating layer;

etching a trench, over said via plug having said first diffusion barrier layer, wherein said via plug with said first diffusion barrier layer is exposed as part of a bottom wall of said trench;

depositing a second diffusion barrier layer onto walls of said trench; and depositing a third conductive material into said trench to form a second metal line, wherein said second metal line is conductively coupled to said second conductive material of said via plug.

9. The method of claim 8, wherein said third conductive material is deposited into said trench using electroplating deposition.

10. The method of claim 8, wherein said second diffusion barrier layer is selected from the group consisting of tantalum, tantalum nitride, tantalum copper, tantalum silicon nitride, tungsten, tungsten nitride, tungsten silicon nitride, titanium nitride, titanium/titanium nitride, and titanium silicon nitride.

11. The method of claim 8, further including the step of:

polishing a top surface of said integrated circuit wafer using a chemical mechanical polish.

12. A method for fabricating a via plug within an integrated circuit wafer, the method comprising the steps of:

depositing a via photoresist layer over a first metal line of copper;

etching a via hole in said via photoresist layer, wherein said copper of said first metal line is exposed at a bottom wall of said via hole;

depositing a via plug of copper into said via hole using electroless deposition with the copper of said first metal line at the bottom wall of said via hole acting as an autocatalytic surface for said electroless deposition of copper into said via hole, wherein said via plug is conductively coupled to said first metal line;

removing said via photoresist layer such that any side wall of said via plug is exposed;

selectively depositing a first diffusion barrier layer of cobalt tungsten phosphide (CoWP) onto any exposed surface of copper of said via plug and onto any exposed surface of said copper of said first metal line;

spin coating a via insulating layer of low dielectric constant to surround said via plug;

depositing a trench insulating layer over said via insulating layer;

etching a trench over said via plug having said first diffusion barrier layer, wherein said via plug with said first diffusion barrier layer is exposed as part of a bottom wall of said trench;

depositing a second diffusion barrier layer onto walls of said trench, wherein said second diffusion barrier layer is selected from the group consisting of tantalum, tantalum nitride, tantalum copper, tantalum silicon nitride, tungsten, tungsten nitride, tungsten silicon nitride, titanium nitride, titanium/titanium nitride, and titanium silicon nitride;

depositing copper into said trench to form a second metal line using electroplating deposition, wherein said second metal line is conductively coupled to said copper of said via plug; and polishing a top surface of said integrated circuit wafer using a chemical mechanical polish.

* * * * *